(12) United States Patent
Hong et al.

(10) Patent No.: US 11,716,890 B2
(45) Date of Patent: Aug. 1, 2023

(54) DISPLAY DEVICE HAVING A LIGHT BLOCKING PATTERN INCLUDING PORTIONS HAVING DIFFERENT SHAPES

(71) Applicant: Samsung Display Co., Ltd., Yongin-si (KR)

(72) Inventors: Seok-Joon Hong, Seongnam-si (KR); Jang-Il Kim, Asan-si (KR); Tae Hyung Hwang, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 301 days.

(21) Appl. No.: 17/156,607

(22) Filed: Jan. 24, 2021

(65) Prior Publication Data

US 2021/0249477 A1    Aug. 12, 2021

(30) Foreign Application Priority Data

Feb. 12, 2020    (KR) ........................ 10-2020-0016873

(51) Int. Cl.
*H10K 59/38*    (2023.01)
*H10K 50/854*    (2023.01)
*H10K 50/86*    (2023.01)
*H10K 59/12*    (2023.01)

(52) U.S. Cl.
CPC ........... *H10K 59/38* (2023.02); *H10K 50/854* (2023.02); *H10K 50/865* (2023.02); *H10K 59/12* (2023.02)

(58) Field of Classification Search
USPC ............................................. 257/40, 89, 79
See application file for complete search history.

(56) References Cited

U.S. PATENT DOCUMENTS

| 10,739,502 | B2 | 8/2020 | Baek et al. |
| 10,833,229 | B2* | 11/2020 | Choi ................. G02B 5/201 |
| 2018/0356677 | A1* | 12/2018 | Kim ................. G02F 1/1368 |
| 2019/0041690 | A1* | 2/2019 | Liu ............... G02F 1/133512 |
| 2020/0266253 | A1 | 8/2020 | Kim et al. |

FOREIGN PATENT DOCUMENTS

| KR | 0-2017-0027276 | 3/2017 |
| KR | 10-2018-0064616 | 6/2018 |

* cited by examiner

*Primary Examiner* — Nduka E Ojeh
(74) *Attorney, Agent, or Firm* — H.C. Park & Associates, PLC (57) ABSTRACT

A display device includes a lower substrate, a plurality of pixels, an upper substrate, a light blocking member, first and second color filters, first and second color conversion patterns, and a light blocking pattern. The light blocking pattern is disposed between the first and second color conversion patterns, and includes a first portion and a second portion which overlaps the light blocking member. A shape the second portion is different from a shape of the first portion.

20 Claims, 10 Drawing Sheets

DISPLAY DEVICE HAVING A LIGHT BLOCKING PATTERN INCLUDING PORTIONS HAVING DIFFERENT SHAPES

CROSS-REFERENCE TO RELATED APPLICATION

This application claims priority from and the benefit of Korean Patent Application No. 10-2020-0016873, filed on Feb. 12, 2020, which is hereby incorporated by reference for all purposes as if fully set forth herein.

BACKGROUND

Field

Exemplary embodiments of the invention relate generally to a display device. More specifically, exemplary embodiments of the invention relate to the display device including a light blocking pattern.

Discussion of the Background

The use of a display device, such as an organic light emitting display device and liquid crystal display device, is increasing. Recently, to improve a light efficiency of the display device, the display device includes a lower structure and an upper structure. Pixels that emit light are disposed in the lower structure and color conversion patterns for converting a color of the light are disposed in the upper structure. Efforts have been made to improve a color reproducibility of the display device by reducing a distance between the upper structure and the lower structure.

The above information disclosed in this Background section is only for understanding of the background of the inventive concepts, and, therefore, it may contain information that does not constitute prior art.

SUMMARY

Exemplary embodiments of the inventive concepts provide a display device including a light blocking pattern.

Additional features of the inventive concepts will be set forth in the description which follows, and in part will be apparent from the description, or may be learned by practice of the inventive concepts.

An exemplary embodiment of the inventive concepts provides a display device including a lower substrate, a plurality of pixels disposed on the lower substrate, an upper substrate disposed on the pixels and facing the lower substrate, a light blocking member disposed on a bottom surface of the upper substrate and extending in a first direction, first and second color filters disposed on the bottom surface of the upper substrate, extending in a second direction orthogonal to the first direction, and overlapping the light blocking member, first and second color conversion patterns disposed on bottom surfaces of the first and second color filters, respectively, spaced apart from each other, extending in the second direction, and overlapping the light blocking member, and a light blocking pattern disposed between the first and second color conversion patterns, extending in the second direction, and including a first portion and a second portion which overlaps the light blocking member. A shape of the second portion may be different from a shape of the first portion.

A bottom surface of the second portion may not overlap bottom surfaces of the first and second color conversion patterns.

A bottom surface of the first portion may overlap a bottom surface of each of the first and second color conversion patterns.

A distance from a bottom surface of the first portion to the lower substrate may be a same as a distance from a bottom surface of each of the first and second color conversion patterns, which overlap the light blocking member, to the lower substrate.

The second portion may fill a space in which the first and second color conversion patterns are spaced apart and the second portion may not overlap a bottom surface of each of the first and second color conversion patterns.

The first portion may extend along a profile of a bottom surface of each of the first and second color conversion patterns and the first portion may partially overlap a bottom surface of each of the first and second color conversion patterns.

The display device may further include a third color filter disposed between the upper substrate and the light blocking member and including first and second openings. The first and second color filters may fill the first and second openings and may extend on a bottom surface of the third color filter adjacent to each of the first and second openings.

The first and second openings may expose the bottom surface of the upper substrate and the first and second color filters may contact the bottom surface of the upper substrate through the first and second openings.

The first color filter may be spaced apart from the second color filter.

The display device may further include a scattering pattern disposed on the bottom surface of the third color filter. A distance from the bottom surface of each of the first and second color conversion patterns to the lower substrate may be less than a distance from a bottom surface of the scattering pattern to the lower substrate.

The pixels may include a first pixel overlapping the first color filter, which transmits a first color, and emitting a light having a fourth color, a second pixel overlapping the second color filter, which transmits a second color, and emitting a light having the fourth color, and a third pixel overlapping the third color filter, which transmits a third color, and emitting a light having the fourth color.

The first color conversion pattern may include a first color conversion material, the second color conversion pattern may include a second color conversion material, and the scattering pattern may include a scattering material.

The first color conversion pattern may convert an incident light into a light having the first color, the second color conversion pattern may convert the incident light into a light having the second color, and the scattering pattern may scatter the incident light.

The first color may be a red color, the second color may be a green color, the third color may be a blue color, and the fourth color may be a white color.

The light blocking member may include an extension portion extending in the second direction and overlapping the first portion.

The display device may further include a pixel defining layer disposed on the lower substrate and overlapping the light blocking member and the light blocking pattern.

Another exemplary embodiment of the inventive concepts provide a display device including a lower substrate including opening areas and a light blocking area surrounding the opening areas, a plurality of pixels disposed in the opening areas on the lower substrate, an upper substrate disposed on the pixels and facing the lower substrate, a light blocking member disposed in the light blocking area on a bottom surface of the upper substrate and including first extension portions and second extension portions, wherein the first extension portions extend in a first direction and are spaced apart from each other in a second direction orthogonal to the first direction. The second extension portions extend in the second direction, are spaced apart from each other in the first direction, and intersect the first extension portions, a plurality of color filters extending in the second direction and disposed between the second extension portions on a bottom surface of the light blocking member, a plurality of color conversion patterns disposed on a bottom surface of each of the color filters and spaced apart each other, and a plurality of light blocking patterns disposed between the color conversion patterns and extending the second direction. Each of the light blocking patterns may include a first portion and a second portion, the first portion may overlap the first extension portions and the second extension portions, the second portion may overlap the second extension portions, and a shape of the second portion may be different from a shape of the first portion.

A bottom surface of the second portion may not overlap bottom surfaces of the color conversion patterns.

A bottom surface of the first portion may overlap a bottom surface of each of the color conversion patterns.

The second portion may fill a space in which the color conversion patterns are spaced apart, and a bottom surface of the second portion may not overlap bottom surfaces of the color conversion patterns.

The display device according to the inventive concepts may include an upper structure including an upper substrate and a lower structure facing the upper structure. The upper structure may include a light blocking member disposed on a bottom surface of the upper substrate, color conversion patterns partially overlapping the light blocking member, and a light blocking pattern disposed between the color conversion patterns. The light blocking pattern may include a first portion not overlapping the light blocking member and a second portion overlapping the light blocking member and a shape of the second portion may be different from a shape of the first portion. Since the shape of the second portion is formed differently from the shape of the first portion, the display device may compensate for a step difference according to the light blocking member. As the step difference is compensated, a distance between the upper structure and the lower structure may be reduced. Accordingly, a color reproducibility of an image displayed on the display device may be improved, and the thickness of the display device may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
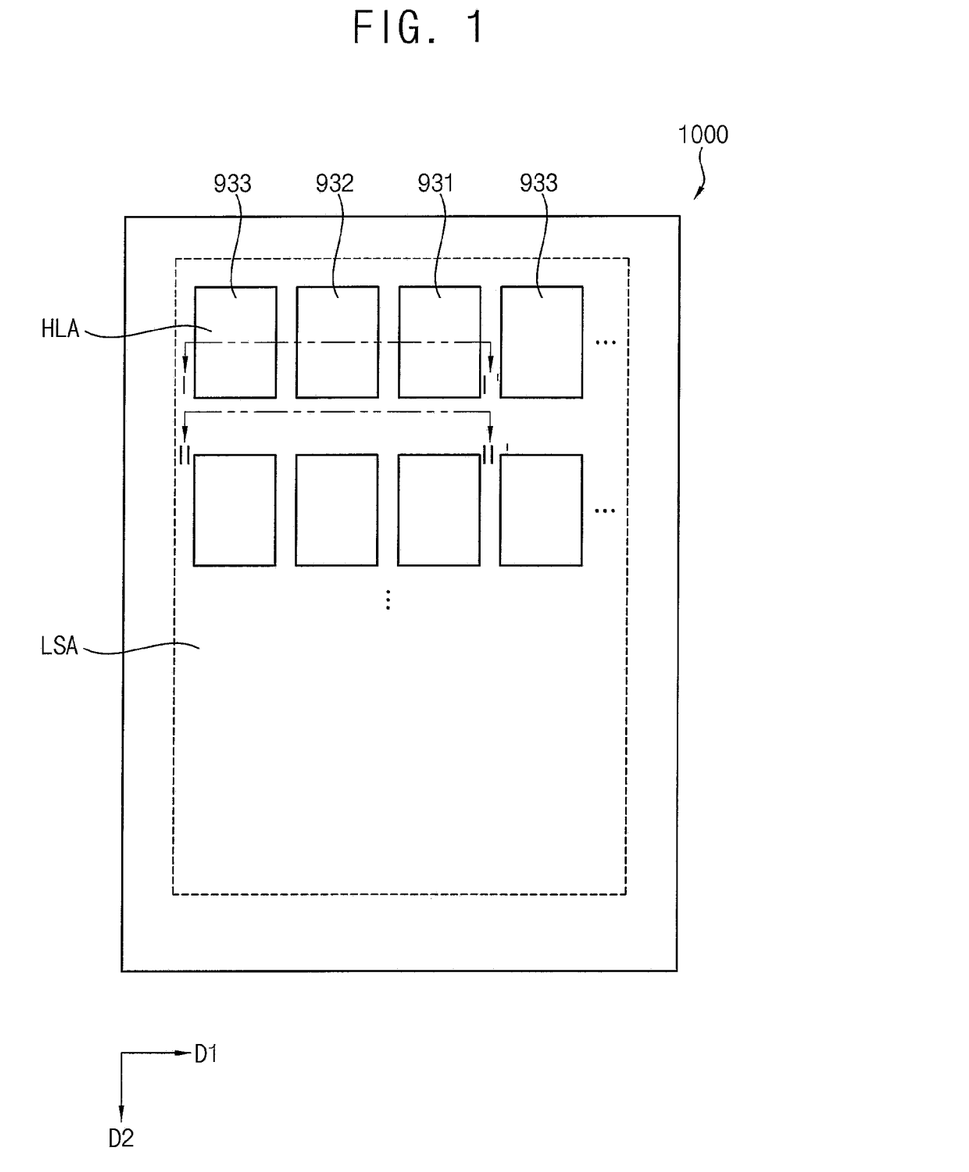
FIG. 1 is a plan view illustrating a display device according to an exemplary embodiment.
Figure 2:
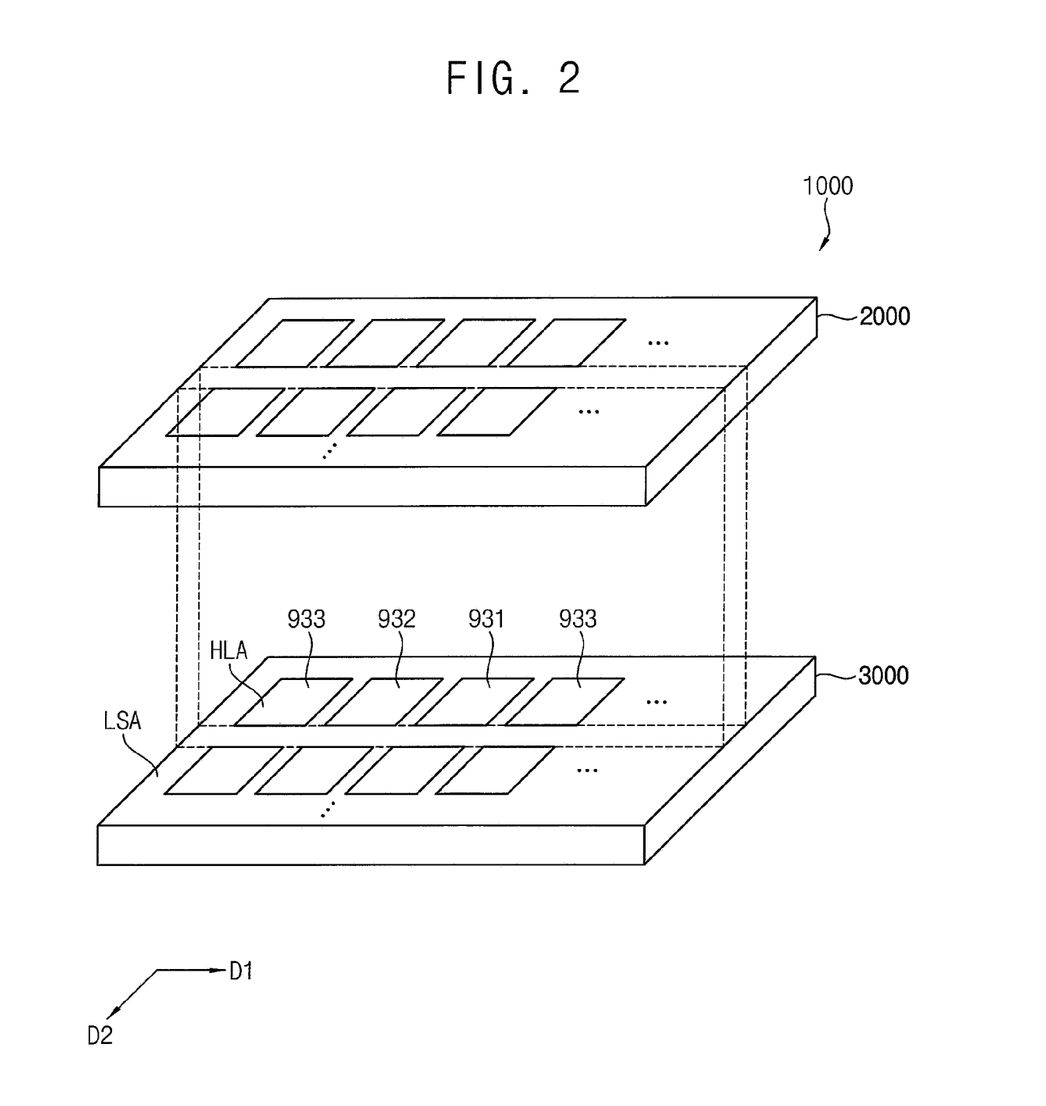
FIG. 2 is a perspective view illustrating the display device of FIG. 1.

FIG. 1 is a plan view illustrating a display device according to an exemplary embodiment. FIG. 2 is a perspective view illustrating the display device of FIG. 1.

Referring to FIGS. 1 and 2, a display device 1000 according to an exemplary embodiment may include a lower structure 3000 and an upper structure 2000 disposed on the lower structure 3000.

The lower structure 3000 may include a lower substrate (e.g., a lower substrate 910 of FIGS. 8 and 9) and a plurality of pixels. The lower substrate may include opening areas HLA and a light blocking area LSA surrounding the opening areas HLA. The pixels may be disposed in the opening areas HLA on the lower substrate.

In an exemplary embodiment, the opening areas HLA may be entirely arranged on the lower substrate in a matrix form. Accordingly, the pixels may be entirely arranged on the lower substrate in the matrix form. The pixels may include a first pixel 931, a second pixel 932, and a third pixel 933.

In an exemplary embodiment, the first-to-third pixels 931, 932, and 933 may emit light having the same color. For example, the first-to-third pixels 931, 932, and 933 may emit light having a blue color or light having a white color. In another exemplary embodiment, the first-to-third pixels 931, 932, and 933 may emit light having different colors, respectively.

The upper structure 2000 may be disposed on the lower structure 3000 and may face the lower structure 3000. For example, the upper structure 2000 may have a size substantially the same as that of the lower structure 3000. The upper structure 2000 may convert colors of light emitted from the first-to-third pixels 931, 932, and 933 included in the lower structure 3000. Accordingly, the display device 1000 may emit light having colors converted by the upper structure 2000 and a user may view an image. As a distance between the lower structure 3000 and the upper structure 2000 (i.e., a thickness of a filler (e.g., a filler 970 of FIGS. 8 and 9) disposed between the lower structure 3000 and the upper structure 2000) decreases, light emitted from the lower structure 3000 may not be mixed with each other in an area between the lower structure 3000 and the upper structure 2000. Accordingly, a color reproducibility of the image displayed on the display device 1000 may be improved.

Figure 3:
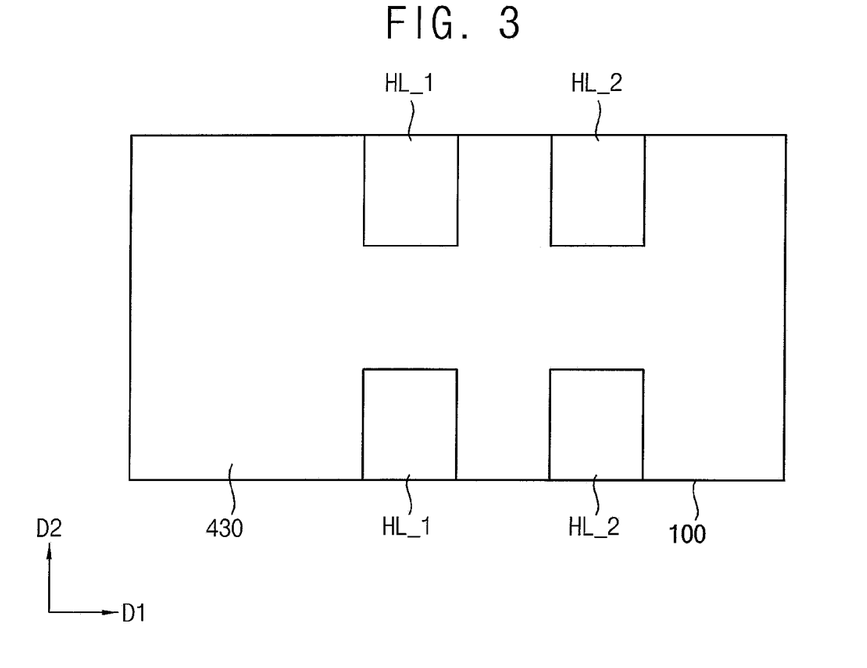
FIG. 3 is a plan view illustrating an upper substrate and a third color filter including the display device of FIG. 1.
Figure 4:
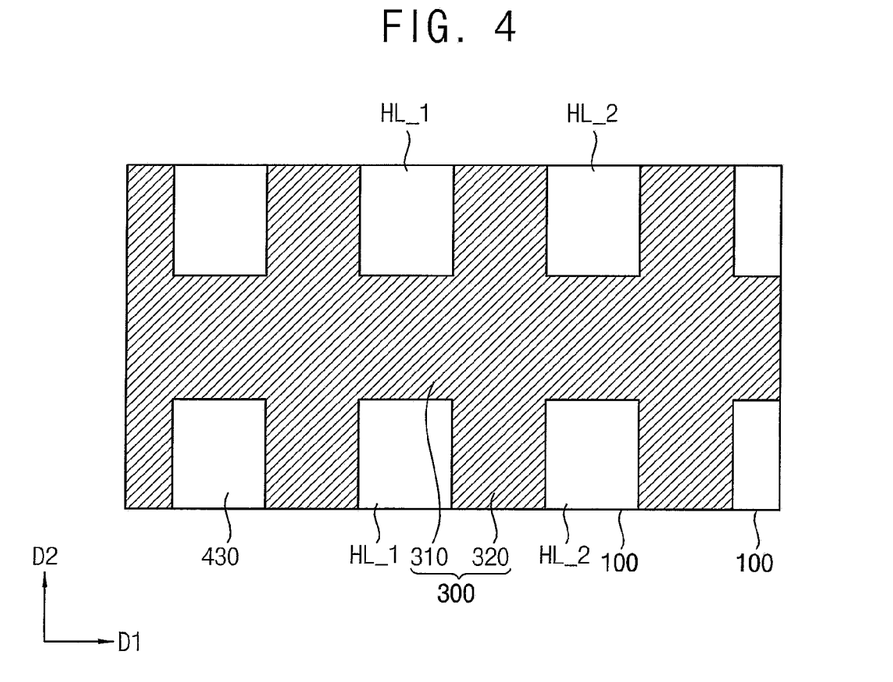
FIG. 4 is a plan view illustrating a light blocking member including the display device of FIG. 1.
Figure 5:
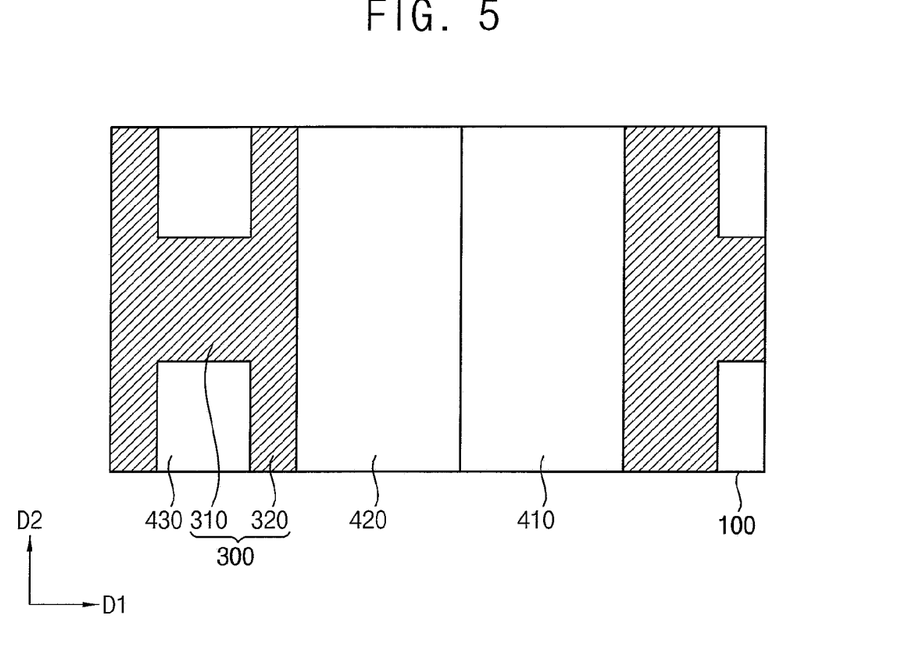
FIG. 5 is a plan view illustrating first and second color filters including the display device of FIG. 1.
Figure 6:
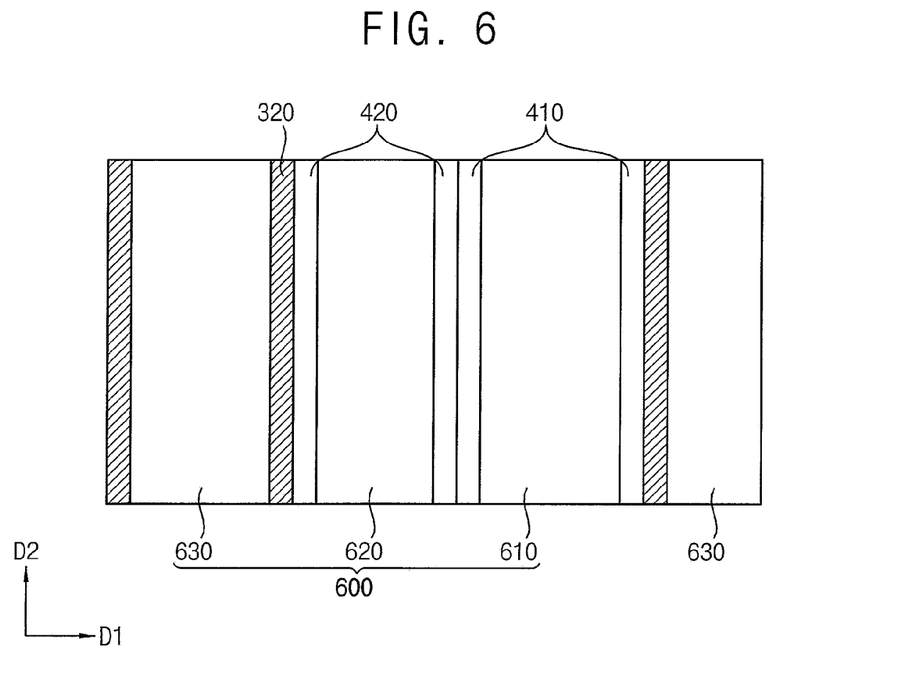
FIG. 6 is a plan view illustrating color conversion patterns including the display device of FIG. 1.
Figure 7:
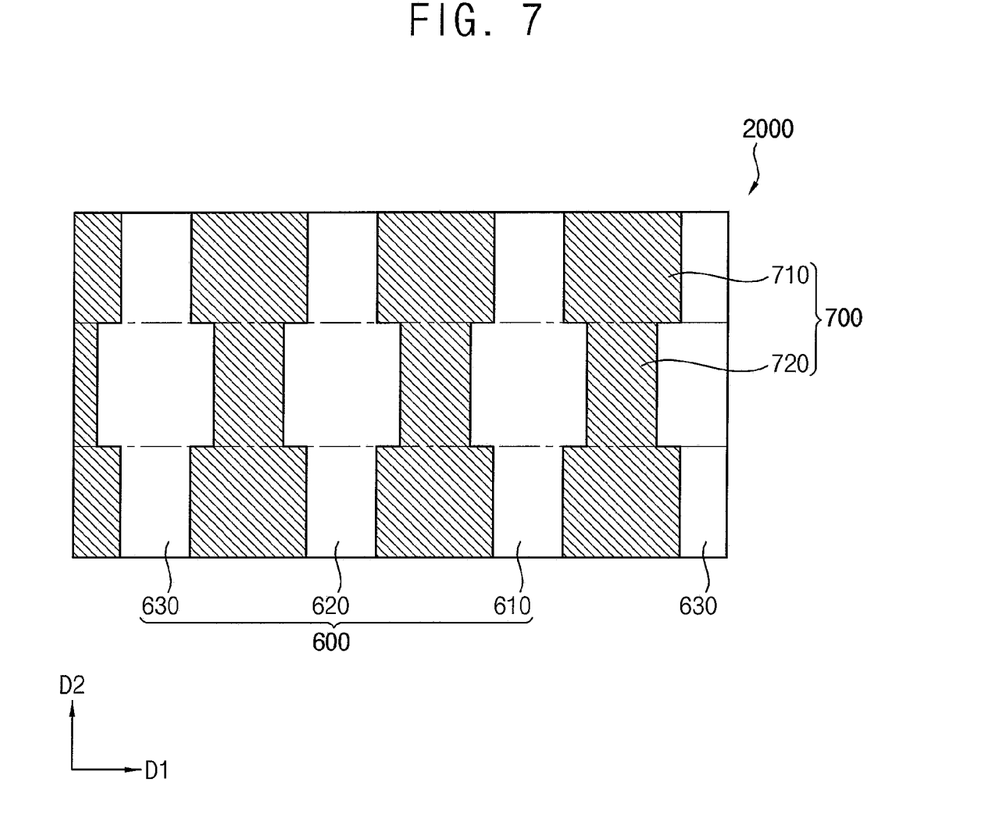
FIG. 7 is a plan view illustrating a light blocking pattern including the display device of FIG. 1.

FIG. 3 is a plan view illustrating an upper substrate and a third color filter including the display device of FIG. 1. FIG. 4 is a plan view illustrating a light blocking member including the display device of FIG. 1. FIG. 5 is a plan view illustrating first and second color filters including the display device of FIG. 1. FIG. 6 is a plan view illustrating color conversion patterns including the display device of FIG. 1. FIG. 7 is a plan view illustrating a light blocking pattern including the display device of FIG. 1.

Referring to FIGS. 2 and 3, the upper structure 2000 may include an upper substrate 100 and a third color filter 430 disposed on a bottom surface of the upper substrate 100. In an exemplary embodiment, the upper substrate 100 may include a transparent material. For example, the upper substrate 100 may be a glass substrate, a quartz substrate, and so on.

The third color filter 430 may be disposed on the bottom surface of the upper substrate 100 and may include first and second openings exposing the bottom surface of the upper substrate 100. In an exemplary embodiment, the third color filter 430 may transmit a third color. Accordingly, an incident light directed to the third color filter 430 may be transmitted as a light having the third color.

Referring to FIGS. 2 and 4, a light blocking member 300 may be disposed on a bottom surface of the third color filter 430. The light blocking member 300 may include a first extension portions 310 extending in a first direction D1 and a second extension portions 320 extending in a second direction D2 orthogonal to the first direction D1. The first extension portions 310 may be spaced apart from each other in the second direction D2 and the second extension portions 320 may be spaced apart from each other in the first direction D1.

Since the first and second extension portions 310 and 320 are spaced from each other, a plurality of openings may be formed in the light blocking member 300. In an exemplary embodiment, the openings may be arranged in the matrix form and may overlap the opening areas HLA of the lower substrate. Some of the openings may overlap first and second openings HL_1 and HL_2. Accordingly, the bottom surface of the upper substrate 100 overlapping the first and second openings HL_1 and HL_2 may still be exposed. In addition, the other openings may expose the third color filter 430.

A step difference according to a thickness of the light blocking member 300 may be formed between an area where the light blocking member 300 is disposed and an area where the openings are formed so that the light blocking member 300 is not disposed.

Referring to FIG. 5, first and second color filters 410 and 420 may be disposed on the bottom surface of the upper substrate 100. In an exemplary embodiment, the first and second color filters 410 and 420 may extend in the second direction D2 and may partially overlap the first extension portions 310 of the light blocking member 300. In this case, the first and second color filters 410 and 420 overlapping the first extension portions 310 may contact a bottom surface of the light blocking member 300. In addition, the first and second color filters 410 and 420 which do not overlap the first extensions 310 may fill the first and second openings HL_1 and HL_2 and may contact the bottom surface of the upper substrate 100 through the first and second openings HL_1 and HL_2.

In an exemplary embodiment, the first color filter 410 may transmit a first color and the second color filter 420 may transmit a second color. Accordingly, the incident light directed to the first color filter 410 may be transmitted as a light having the first color and the incident light directed to the second color filter 420 may be transmitted as a light having the second color.

Referring to FIG. 6, color conversion patterns 600 may be disposed on the bottom surface of the upper substrate 100. For example, the color conversion patterns 600 may include a first color conversion pattern 610, a second color conversion pattern 620, and a scattering pattern 630. The first color conversion pattern 610 may overlap the first color filter 410. The second color conversion pattern 620 may overlap the second color filter 420. A portion of the scattering pattern 630 may overlap the first extension portions 310 and another portion of the scattering pattern 630 may not overlap the first extension portions 310. In an exemplary embodiment, as shown in FIG. 6, the first color conversion pattern 610, the second color conversion pattern 620, and the scattering pattern 630 may be spaced apart from each other in the first direction D1.

Referring to FIGS. 2 and 7, a light blocking pattern 700 may be disposed between the color conversion patterns 600. The light blocking pattern 700 may block (e.g., absorb or reflect) an incident light. Because the light blocking pattern 700 is disposed between the color conversion patterns 600, the color reproducibility of the image displayed on the display device 1000 may be improved. For example, a light emitted from the first pixel 931 may not be incident to the second color conversion pattern 620 and the scattering pattern 630 by the light blocking pattern 700.

In an exemplary embodiment, the light blocking pattern 700 may extend in the second direction D2. Accordingly, the light blocking pattern 700 may include a first portion 710 and a second portion 720. The first portion 710 may not overlap the first extension portions 310 and the second portion 720 may overlap the first extension portions 310. In this case, a shape of the first portion 710 may be different from a shape of the second portion 720. For example, as the shape of the first portion 710 is different from the shape of the second portion 720, the light blocking pattern 700 may have a shape similar to an English letter 'I' on a plane. In other words, light blocking pattern 700 may have a shape of a bar having grooves recessed inward on a plane.

As described above, the step difference according to a thickness of the light blocking member 300 may be formed between an area where the light blocking member 300 is disposed and an area where the light blocking member 300 is not disposed. In a conventional display device that does not compensate for the step difference, the distance between the upper structure and the lower structure cannot be reduced by the step difference.

However, because the display device 1000 includes the light blocking pattern 700 in which the shape of the first portion 710 and the shape of the second portion 720 are different from each other, the distance between the upper structure 2000 and the lower structure 3000 may be reduced by compensating for the step difference. Since the distance between the upper structure 2000 and the lower structure 3000 is reduced, the color reproducibility of the image displayed on the display device 1000 may be improved and a thickness of the display device 1000 may be reduced. The shapes of the first and second portions 710 and 720 will be described with reference to FIGS. 8 and 9.

Figure 8:
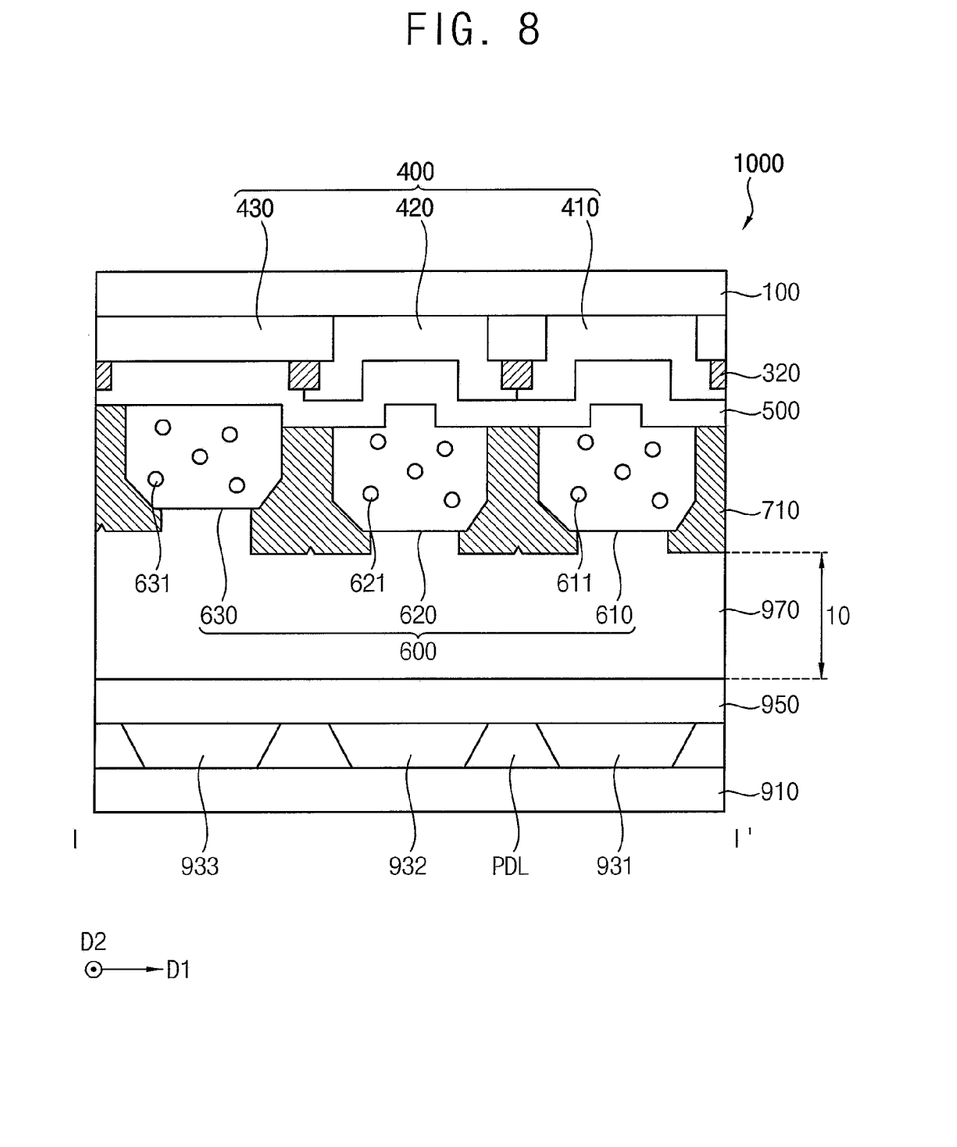
FIG. 8 is a cross-sectional view taken along line I-I' of FIG. 1.
Figure 9:
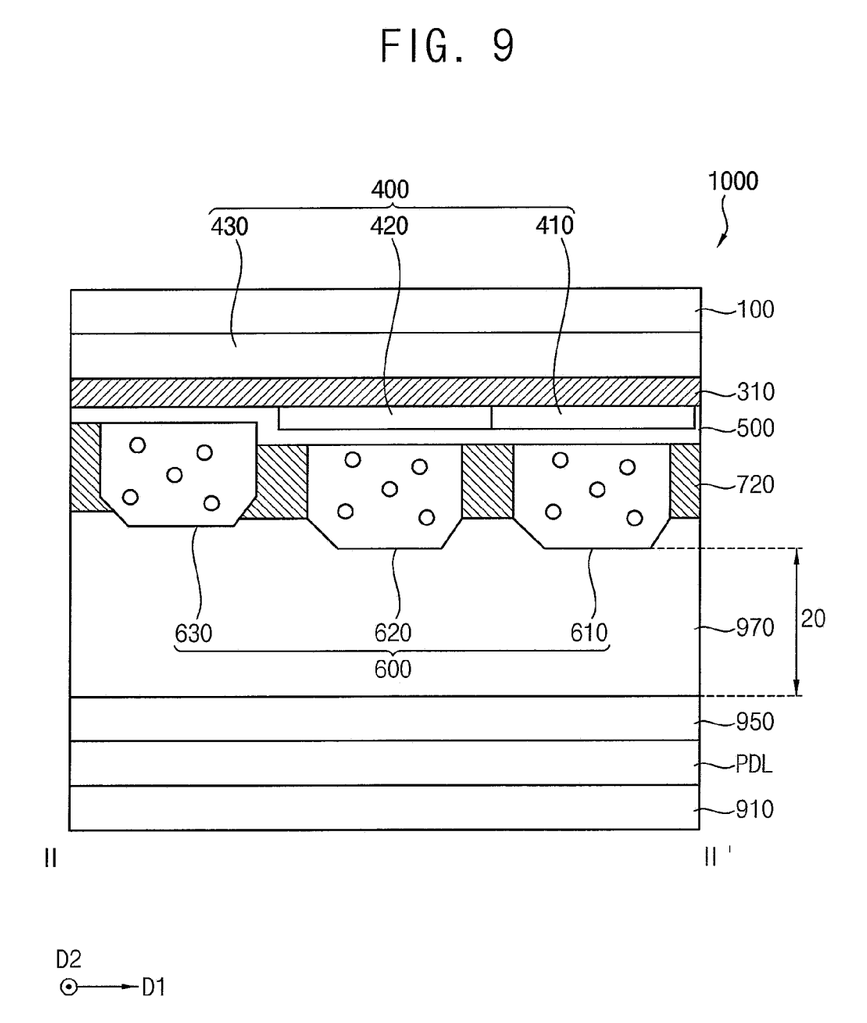
FIG. 9 is a cross-sectional view taken along line II-IF of FIG. 1.

FIG. 8 is a cross-sectional view taken along line I-I' of FIG. 1. FIG. 9 is a cross-sectional view taken along line II-IF of FIG. 1.

Referring to FIGS. 2, 7, 8, and 9, the display device 1000 may include the upper structure 2000 and the lower structure 3000. The upper structure 2000 may include the upper substrate 100, the color filters 400, the first extension portions 310, the second extension portions 320, a transparent insulating layer 500, the color conversion patterns 600, the first portion 710, and the second portion 720. The lower structure 3000 may include the lower substrate 910, the first-to-third pixels 931, 932, and 933, a pixel defining layer PDL, a thin film encapsulation layer 950, and the filler 970.

The lower substrate 910 may include a transparent or an opaque material. For example, the lower substrate 910 may include a glass substrate, a quartz substrate, a polyimide substrate, and the like. In an exemplary embodiment, the lower substrate 910 may be a substrate a substantially same as the upper substrate 100. As described above, the lower substrate 910 may include the opening areas HLA and the light blocking area LSA.

The first-to-third pixels 931, 932, and 933 may be disposed on the opening areas HLA on the lower substrate 910. In an exemplary embodiment, the first-to-third pixels 931, 932, and 933 may overlap the first-to-third color filters 410, 420, and 430, respectively.

The pixel defining layer PDL may be disposed in the light blocking area LSA of the lower substrate 910. In an exemplary embodiment, the pixel defining layer PDL may overlap the light blocking member 300 and the light blocking pattern 700, which are disposed on the bottom surface of the upper substrate 100.

The thin film encapsulation layer 950 may cover the first-to-third pixels 931, 932, and 933 and the pixel defining layer PDL on the lower substrate 100. The thin film encapsulation layer 950 may prevent moisture and oxygen from penetrating into the first-to-third pixels 931, 932, and 933 and, for this, the thin film encapsulation layer 950 may have a structure in which inorganic layers and organic layers are alternately arranged.

The filler 970 may be disposed on the thin film encapsulation layer 950. The filler 970 may be substantially transparent and may include a material that does not reduce a transmittance of light emitted from the first-to-third pixels 931, 932 and 933. In an exemplary embodiment, a transparent organic material or a transparent inorganic material may be used as the filler 970 by interposing a space between the thin film encapsulation layer 950 and the upper structure 2000. In another exemplary embodiment, air may be used as the filler 970 by interposing the space between the thin film encapsulation layer 950 and the upper structure 2000.

Although not illustrated, the display device 1000 may further include a sealing member disposed between the lower substrate 910 and the upper substrate 100 and surrounding an outer portion of the display device 1000. The sealing member may protect components (e.g. the first-to-third pixels 931, 932, and 933, the color conversion patterns 600, and so on) disposed inside the display device 1000 from foreign materials that may penetrate from the outside.

In an exemplary embodiment, the first-to-third pixels 931, 932, and 933 may emit light having the same color. For example, the first pixel 931 may emit light having a fourth color toward the first color conversion pattern 610. The second pixel 932 may emit light having the fourth color toward the second color conversion pattern 620. The third pixel 933 may emit light having the fourth color toward the scattering pattern 630. In this case, the fourth color may be blue or white. In another exemplary embodiment, the first-to-third pixels 931, 932, and 933 may emit light having different colors. In this case, the first pixel 931 may emit light having a red color, the second pixel 932 may emit light having a green color, and the third pixel 933 may emit light having a blue color.

The first color conversion pattern 610 may convert a color of light emitted by the first pixel 931. For example, the first color conversion pattern 610 may include a first color conversion material 611 that converts a peak wavelength of an incident light to a predetermined peak wavelength. In an exemplary embodiment, the first color conversion pattern 610 may convert the incident light into a light having a first color. In this case, the first color may be red.

The second color conversion pattern 620 may convert a color of light emitted by the second pixel 932. For example, the second color conversion pattern 620 may include a second color conversion material 621 that converts a peak wavelength of an incident light to a predetermined peak wavelength. In an exemplary embodiment, the second color conversion pattern 620 may convert the incident light into a light having a second color. In this case, the second color may be green.

In an exemplary embodiment, each of the first and second color conversion materials 611 and 621 may be at least one of a quantum dot and a phosphor. Electrons included in the quantum dot may transition from a conduction band to a valence band by the incident light incident on the quantum dot and, accordingly, the quantum dot may emit a specific color. The quantum dot may have a core-shell structure. For example, the core may include silicon-based nanocrystals, II-VI-based compound nanocrystals, III-V-based compound nanocrystals, and the like, and the shell may include zinc sulfide (ZnS).

The scattering pattern 630 may scatter light emitted by the third pixel 933. Accordingly, the light emitted from the third pixel 933 may pass through the scattering pattern 630. For example, the scattering pattern 630 may include a scattering material 631 that induces scattering of the incident light. The scattering material 631 may be a material that can scatter or reflect light. For example, the scattering material 631 may be at least one of metal oxides (e.g., titanium oxide, zirconium oxide, indium oxide, zinc oxide, tin oxide, etc.) and organic materials (e.g., acrylic resins, urethane resins, etc.).

In an exemplary embodiment, each of the first-to-third color filters 410, 420, and 430 may be a wavelength-selective optical filter that selectively transmits only a portion of a wavelength band of the incident light. For example, each of the first-to-third color filters 410, 420, and 430 may transmit light in a specific wavelength band and block light in another specific wavelength band. The color filters 400 may include pigments or dyes that block light in a specific wavelength band.

The first color filter 410 may transmit the first color. In other words, the first color filter 410 may transmit light in a specific wavelength band and block light in another specific wavelength band. For example, the first color filter 410 may transmit light having the first color converted by the first color conversion pattern 610 and may not transmit light having the fourth color not converted by the first color conversion pattern 610.

The second color filter 420 may transmit the second color. In other words, the second color filter 420 may transmit light in a specific wavelength band and block light in another specific wavelength band. For example, the second color filter 420 may transmit light having the second color converted by the second color conversion pattern 620 and may not transmit light having the fourth color not converted by the second color conversion pattern 620.

The third color filter 430 may transmit the third color. In other words, the third color filter 430 may transmit light in a specific wavelength band and block light in another specific wavelength band. For example, the third color filter 430 may transmit light having the third color scattered by the scattering pattern 630.

In an exemplary embodiment, the transparent insulating layer 500 may be disposed on a bottom surface of the light blocking member 300 and a bottom surface of the color filters 400. For example, the transparent insulating layer 500 may cover the light blocking member 300 and the color filters 400 and may be disposed to have a uniform thickness along a profile of the light blocking member 300 and the color filters 400. The transparent insulating layer 500 may separate the color filters 400 and the color conversion patterns 600, the light converted from the color conversion patterns 600 may be incident to the color filters 400 through the transparent insulating layer 500.

As described above, the light blocking pattern 700 may be disposed between the color conversion patterns 600 spaced apart from each other. To prevent light emitted from the first-to-third pixels 931, 932, and 933 from mixing with each other before reaching the color conversion patterns 600 and to secure a process margin, a bottom surface of the first portion 710 of the light blocking pattern 700 may overlap the bottom surface of each of the color conversion patterns 600. For example, as shown in FIG. 8, the first portion 710 may extend along a profile of the bottom surface of each of the color conversion patterns 600. Accordingly, a first distance 10 between the bottom surface of the first portion 710 and a top surface of the thin film encapsulation layer 950 may be defined.

As shown in FIG. 9, the first and second color filters 410 and 420 may be disposed on bottom surfaces of the first extension portions 310 and the third color filter 430 may be disposed between the upper substrate 100 and the first extension portions 310. Accordingly, in an exemplary embodiment, a distance from a bottom surface of each of the first and second color conversion patterns 610 and 620 to the lower substrate 910 may be less than a distance from a bottom surface of the scattering pattern 630 to the lower substrate 910.

As described above, the shape of the second portion 720 of the light blocking pattern 700 may be different from the shape of the first portion 710 of the light blocking pattern 700. For example, a bottom surface of the second portion 720 of the light blocking pattern 700 may not overlap with the bottom surfaces of the color conversion patterns 600. Accordingly, a second distance 20 between the bottom surfaces of the color conversion patterns 600 overlapping the first extensions 310 and the top surface of the thin film encapsulation layer 950 may be defined.

Similar to the display device 1000 according to exemplary embodiments, the conventional display device includes the step difference according to the thickness of the light blocking member. On the other hand, unlike the display device 1000 according to exemplary embodiments, in the conventional display device, the shape of the second portion of the light blocking pattern is a same as the shape of the first portion of the light blocking pattern. That is, the bottom surface of the second portion of the light blocking pattern overlaps the bottom surfaces of the color conversion patterns. Accordingly, the conventional display device cannot compensate for the step difference. In other words, the conventional display device includes an upper structure in which the bottom surface of the second portion of the light blocking pattern becomes the lowest point. Therefore, even if the second portion of the light blocking pattern, which is the lowest point of the upper structure, is approached as close as possible to the lower structure, the conventional display device is limited in reducing the distance between the upper structure and the lower structure.

However, the display device 1000 according to exemplary embodiments may include the light blocking pattern 700 including the first portion 710 and the second portion 720 having different shapes. That is, the bottom surface of the second portion 720 of the light blocking pattern 700 may not overlap with the bottom surfaces of the color conversion patterns 600. Accordingly, the display device 1000 may compensate for the step difference according to the thickness of the light blocking member 300. In other words, the display device 1000 may include the upper structure 2000 in which the color conversion patterns 600 overlapping the first extensions 310 of the light blocking member 300 become the lowest point. Accordingly, when the color conversion patterns 600, which are the lowest point of the upper structure 2000, are closer to the lower structure 3000, the distance between the upper structure 2000 and the lower structure 3000 may be further reduced than the distance of the conventional display device. As the distance between the upper structure 2000 and the lower structure 3000 is reduced, the color reproducibility of the image displayed on the display device 1000 may be improved and the thickness of the display device 1000 may be reduced.

In an exemplary embodiment, the first distance 10 and the second distance 20 may be substantially the same. When the first distance 10 and the second distance 20 are substantially the same, since the step difference is completely compensated, the upper structure 2000 may approach the lower structure 3000 more closely.

In FIGS. 8 and 9, for convenience of description, ratios of the first and second distances 10 and 20 to the thickness of the display device 1000 are largely illustrated. However, the ratios of the first and second distances 10 and 20 to the thickness of the display device 1000 that are actually implemented may be less than the ratios of the first and second distances 10 and 20 to the thickness of the display device 1000 shown in FIGS. 8 and 9.

Figure 10:
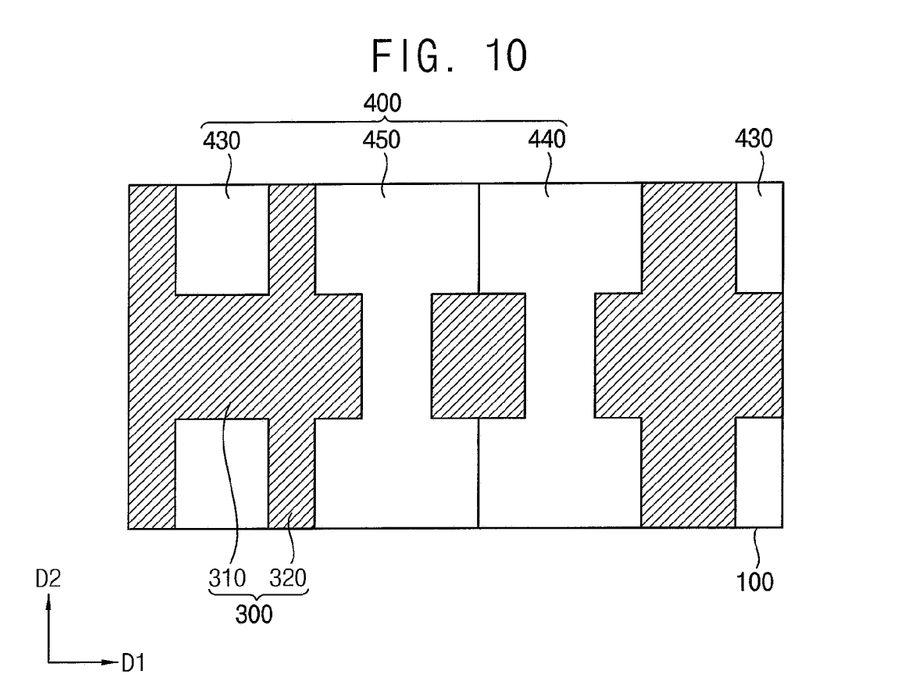
FIGS. 10, 11, and 12 are plan views illustrating a display device according to another example embodiment.
Figure 11:
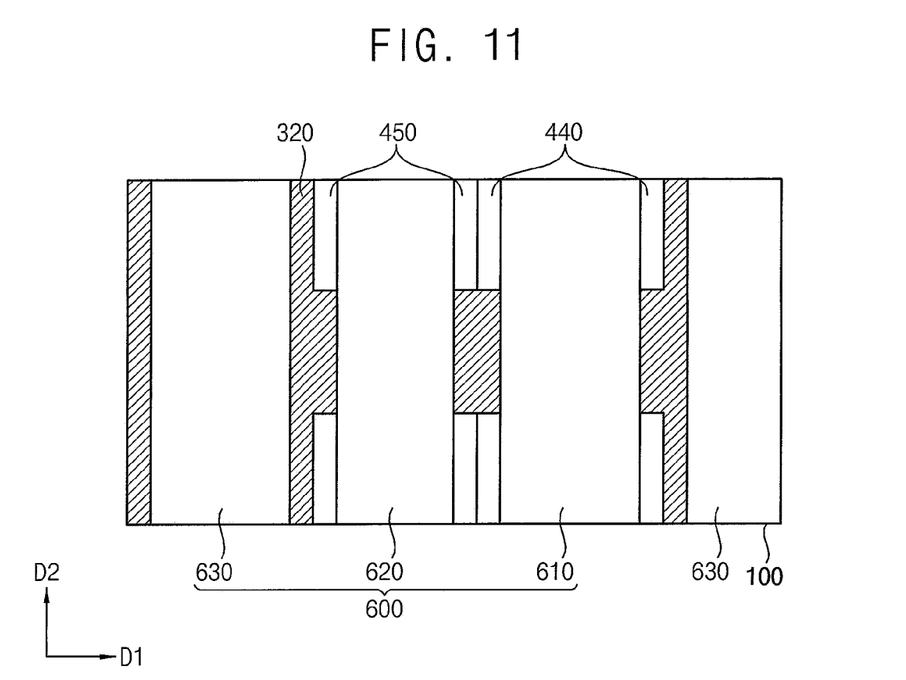
Figure 12:
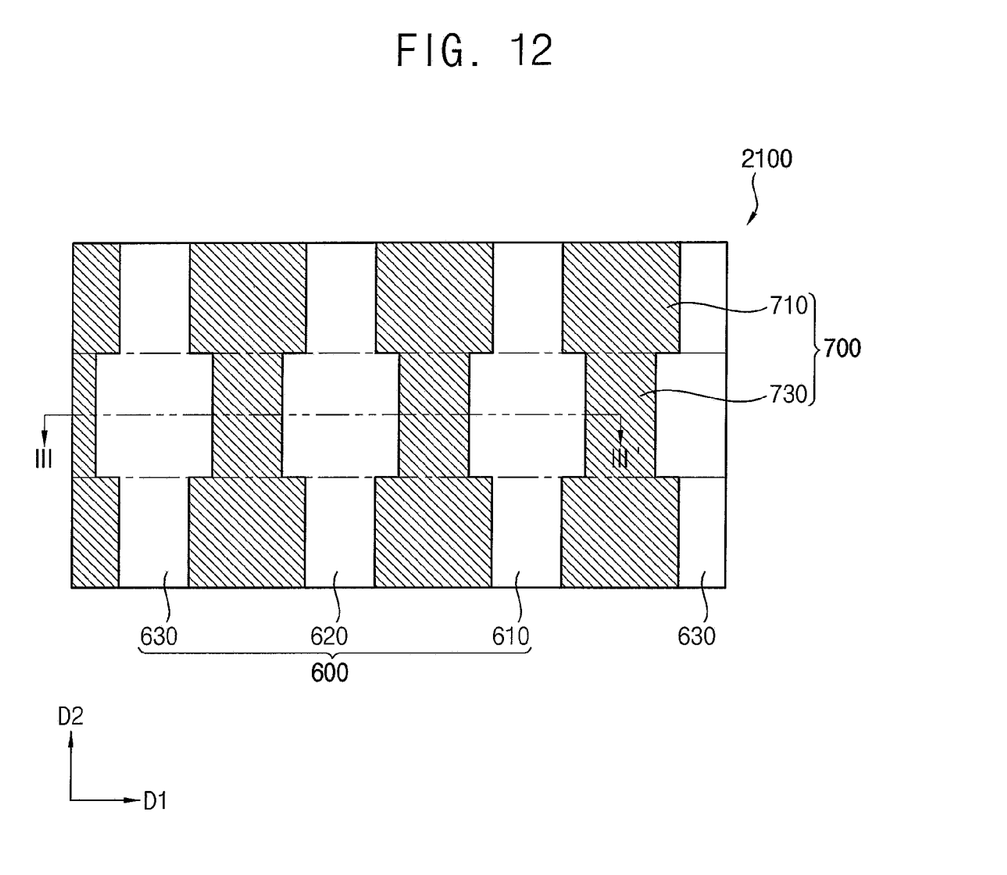
Figure 13:
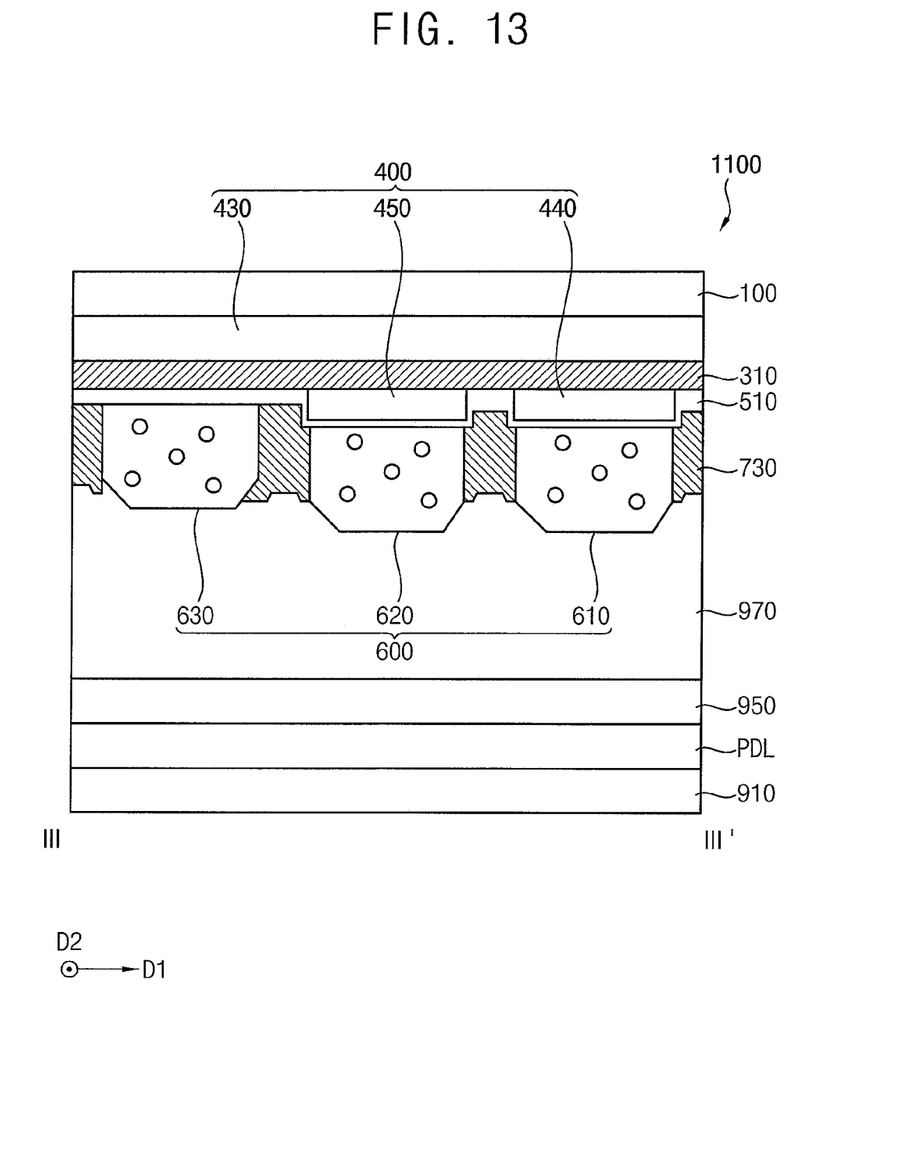
FIG. 13 is a cross-sectional view taken along line of FIG. 12.

FIGS. 10 to 12 are plan views illustrating a display device according to another exemplary embodiment. FIG. 13 is a cross-sectional view taken along line of FIG. 12.

Referring to FIGS. 10, 11, 12, and 13, a display device 1100 according to another exemplary embodiment may include a lower structure and an upper structure 2100 disposed on the lower structure. The upper structure 2100 may include an upper substrate 100, a light blocking member 300, a first color filter 440, a second color filter 450, a third color filter 430, a transparent insulating layer 510, and color conversion patterns 600, a first portion 710 of a light blocking pattern 700, and a second portion 730 of the light blocking pattern 700. However, since the display device 1100 is substantially the same as the display device 1000 described with reference to FIGS. 7 to 9 except for the first color filter 440, the second color filter 450, the transparent insulating layer 510, and the second portion 730 of the light blocking pattern 700, hereinafter, the first color filter 440, the second color filter 450, the transparent insulating layer 510, and the second portion 730 of the light blocking pattern 700 will be described in detail.

As shown in FIGS. 10 and 13, the third color filter 430 may be disposed on the bottom surface of the upper substrate 100, and the light blocking member 300 may be disposed on the bottom surface of the third color filter 430. The first and second color filters 440 and 450 may be disposed on the bottom surface of the upper substrate 100.

In an exemplary embodiment, as shown in FIG. 10, the first color filter 440 and the second color filter 450 may be partially spaced apart. For example, the first color filter 440 overlapping the first extension portions 310 and the second color filter 450 overlapping the first extension portions 310 may be spaced apart from each other in the first direction D1 and the first color filter 440 that does not overlap the first extension portions 310 and the second color filter 450 that does not overlap the first extension portions 310 may contact each other. The transparent insulating layer 510 may cover the first extension portions 310, the first color filter 440, and the second color filter 450, and may be disposed along a profile of bottom surfaces of the above-described components.

In another exemplary embodiment, the first color filter and the second color filter may be entirely spaced apart from each other. For example, the first color filter extending in the second direction D2 and the second color filter extending in the second direction D2 may be spaced apart in the first direction D1. Accordingly, the first and second color filters may not contact each other.

In still another exemplary embodiment, the first color filter overlapping the first extension portions 310 and the second color filter overlapping the first extension portions 310 may be selectively removed. Accordingly, the first color filter may be arranged in an island shape spaced apart in the second direction D2 and the second color filter may also be arranged in an island shape spaced apart from each other in the second direction D2.

As shown in FIG. 11, the color conversion patterns 600 may be disposed on the bottom surface of the upper substrate 100. For example, the color conversion patterns 600 may include the first color conversion pattern 610 overlapping the first color filter 440, the second color conversion pattern 620 overlapping the second color filter 450, and the scattering pattern 630 overlapping the third color filter 430.

As shown in FIG. 12, the light blocking pattern 700 may be disposed between the color conversion patterns 600. In the above-described exemplary embodiments, the bottom surface of the second portion 730 of the light blocking pattern 700 may not overlap the bottom surfaces of the color conversion patterns 600. In other words, as shown in FIG. 13, by separating the first and second color filters 440 and 450, the bottom surface of the second portion 730 of the light blocking pattern 700 may not overlap the color conversion patterns 600. Accordingly, the display device 1100 may compensate for the step difference according to the thickness of the light blocking member 300 described above. Therefore, the display device 1100 may reduce the distance between the upper structure 2000 and the lower structure 3000. As the distance between the upper structure 2000 and the lower structure 3000 is reduced, the color reproducibility of the image displayed on the display device 1100 may be improved and the thickness of the display device 1100 may be reduced.

The display device according to exemplary embodiments may compensate for the step difference according to the thickness of the light blocking member by forming the shape of the second portion of the light blocking pattern different from the shape of the first portion of the light blocking pattern. Accordingly, since the upper structure can approach the lower structure more closely, the distance between the upper structure and the lower structure may be reduced. Therefore, the color reproducibility of the image displayed on the display device may be improved and the thickness of the display device may be reduced.

The inventive concepts may be applied to an organic light emitting display device and an electronic device using the organic light emitting display device. For example, the inventive concepts may be applied to a cellular phone, a smart phone, a video phone, a smart pad, a smart watch, a tablet PC, a car navigation system, a television, a computer monitor, a laptop, etc.

The foregoing is illustrative of exemplary embodiments and is not to be construed as limiting thereof. Although a few example embodiments have been described, those skilled in the art will readily appreciate that many modifications are possible in the exemplary embodiments without departing from the spirit and scope of the present inventive concept as defined by the appended claims.

What is claimed is:

1. A display device comprising:
a lower substrate;
a plurality of pixels disposed on the lower substrate;
an upper substrate disposed on the pixels and facing the lower substrate;
a light blocking member disposed on a bottom surface of the upper substrate and extending in a first direction;
first and second color filters disposed on the bottom surface of the upper substrate, extending in a second direction orthogonal to the first direction, and overlapping the light blocking member;
first and second color conversion patterns disposed on bottom surfaces of the first and second color filters, respectively, spaced apart from each other, extending in the second direction, and overlapping the light blocking member; and
a light blocking pattern disposed between the first and second color conversion patterns, extending in the second direction, and including a first portion and a second portion which overlaps the light blocking member,
wherein a shape of the second portion is different from a shape of the first portion.

2. The display device of claim 1, wherein a bottom surface of the second portion does not overlap bottom surfaces of the first and second color conversion patterns.

3. The display device of claim 1, wherein a bottom surface of the first portion overlaps a bottom surface of each of the first and second color conversion patterns.

4. The display device of claim 1, wherein a distance from a bottom surface of the first portion to the lower substrate is a same as a distance from a bottom surface of each of the first and second color conversion patterns, which overlap the light blocking member, to the lower substrate.

5. The display device of claim 1, wherein:
the second portion fills a space in which the first and second color conversion patterns are spaced apart; and
the second portion does not overlap a bottom surface of each of the first and second color conversion patterns.

6. The display device of claim 1, wherein:
the first portion extends along a profile of a bottom surface of each of the first and second color conversion patterns; and
the first portion partially overlaps a bottom surface of each of the first and second color conversion patterns.

7. The display device of claim 1, further comprising a third color filter disposed between the upper substrate and the light blocking member and including first and second openings,
wherein the first and second color filters fill the first and second openings and extend on a bottom surface of the third color filter adjacent to each of the first and second openings.

8. The display device of claim 7, wherein:
the first and second openings expose the bottom surface of the upper substrate; and the first and second color filters contact the bottom surface of the upper substrate through the first and second openings.

9. The display device of claim 7, wherein the first color filter is spaced apart from the second color filter.

10. The display device of claim 7, further comprising a scattering pattern disposed on the bottom surface of the third color filter,
wherein a distance from the bottom surface of each of the first and second color conversion patterns to the lower substrate is less than a distance from a bottom surface of the scattering pattern to the lower substrate.

11. The display device of claim 10, wherein the pixels include:
a first pixel overlapping the first color filter, which transmits a first color, and emitting a light having a fourth color;
a second pixel overlapping the second color filter, which transmits a second color, and emitting a light having the fourth color; and
a third pixel overlapping the third color filter, which transmits a third color, and emitting a light having the fourth color.

12. The display device of claim 11, wherein:
the first color conversion pattern includes a first color conversion material;
the second color conversion pattern includes a second color conversion material; and
the scattering pattern includes a scattering material.

13. The display device of claim 11, wherein:
the first color conversion pattern converts an incident light into a light having the first color;
the second color conversion pattern converts the incident light into a light having the second color; and
the scattering pattern scatters the incident light.

14. The display device of claim 11, wherein the first color is a red color, the second color is a green color, the third color is a blue color, and the fourth color is a white color.

15. The display device of claim 1, wherein the light blocking member includes an extension portion extending in the second direction and overlapping the first portion.

16. The display device of claim 1, further comprising:
a pixel defining layer disposed on the lower substrate and overlapping the light blocking member and the light blocking pattern.

17. A display device comprising:
a lower substrate including opening areas and a light blocking area surrounding the opening areas;
a plurality of pixels disposed in the opening areas on the lower substrate;
an upper substrate disposed on the pixels and facing the lower substrate;
a light blocking member disposed in the light blocking area on a bottom surface of the upper substrate and including first extension portions and second extension portions, wherein the first extension portions extend in a first direction and are spaced apart from each other in a second direction orthogonal to the first direction, and wherein the second extension portions extend in the second direction, are spaced apart from each other in the first direction, and intersect the first extension portions;
a plurality of color filters extending in the second direction and disposed between the second extension portions on a bottom surface of the light blocking member;
a plurality of color conversion patterns disposed on a bottom surface of each of the color filters and spaced apart each other; and
a plurality of light blocking patterns disposed between the color conversion patterns and extending the second direction,
wherein:
each of the light blocking patterns includes a first portion and a second portion;
the first portion overlaps the first extension portions and the second extension portions,
the second portion overlaps the second extension portions; and
a shape of the second portion is different from a shape of the first portion.

18. The display device of claim 17, wherein a bottom surface of the second portion does not overlap bottom surfaces of the color conversion patterns.

19. The display device of claim 17, wherein a bottom surface of the first portion overlaps a bottom surface of each of the color conversion patterns.

20. The display device of claim 17, wherein:
the second portion fills a space in which the color conversion patterns are spaced apart; and
a bottom surface of the second portion does not overlap bottom surfaces of the color conversion patterns.

* * * * *